US 6,600,679 B2

(12) United States Patent
Tanzawa et al.

(10) Patent No.: US 6,600,679 B2
(45) Date of Patent: Jul. 29, 2003

(54) LEVEL SHIFTER FOR CONVERTING A VOLTAGE LEVEL AND A SEMICONDUCTOR MEMORY DEVICE HAVING THE LEVEL SHIFTER

(75) Inventors: Toru Tanzawa, Ebina (JP); Kentaro Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/033,442

(22) Filed: Dec. 27, 2001

(65) Prior Publication Data

US 2002/0080651 A1 Jun. 27, 2002

(30) Foreign Application Priority Data

Dec. 27, 2000 (JP) .......................... 2000-398388

(51) Int. Cl.[7] .............. G11C 7/00; G11C 8/00
(52) U.S. Cl. .............. 365/189.11; 365/230.06; 365/226
(58) Field of Search ............. 365/189.11, 154, 365/149, 226, 185.01, 230.06

(56) References Cited

U.S. PATENT DOCUMENTS

| 4,109,163 A | * | 8/1978 | Cricchi et al. | ......... 365/189.11 |
| 4,110,841 A | * | 8/1978 | Schroeder | ............. 365/154 |
| 5,696,722 A | * | 12/1997 | Yamauchi | ......... 365/189.11 |
| 5,825,205 A | | 10/1998 | Ohtuska | ............... 326/81 |

FOREIGN PATENT DOCUMENTS

JP  2000-286391  10/2000

* cited by examiner

*Primary Examiner*—Thong Q. Le
(74) *Attorney, Agent, or Firm*—Frommer Lawrence & Haug LLP; Grace L. Pan

(57) ABSTRACT

A level shifter comprises a latch circuit, a first capacitor and a second capacitor. The latch circuit has a first node and a second node set to a first voltage or a second voltage. The second node is set to the second voltage when the first node is set to the first voltage and the second node is set to the first voltage when the first node is set to the second voltage. A first terminal side of the first capacitor is connected to the first node. A first signal is supplied to a second terminal side of the first capacitor. A third terminal side of the second capacitor is connected to the second node. When the first signal is supplied to the second terminal side of the first capacitor, an inverted replica of the first signal is supplied to a fourth terminal side of the second capacitor.

23 Claims, 7 Drawing Sheets

FIG. 4
PRIOR ART
| | Read | Write | Erase |
|---|---|---|---|
| Vg | 5V | 9V | -7.5V |
| Vd | 1V | 5V("0") 0V("1") | Floating |
| Vs | 0V | 0V | 9V |
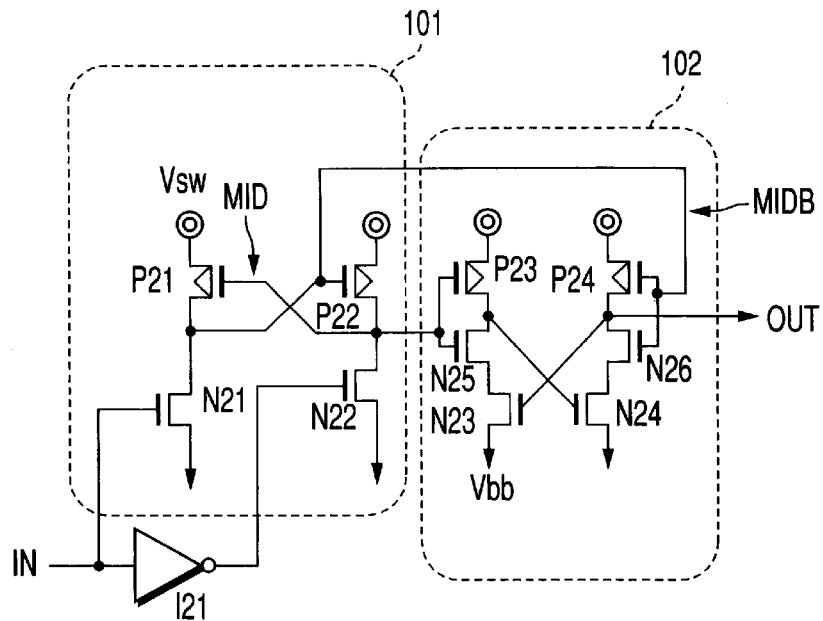
FIG. 5A
PRIOR ART
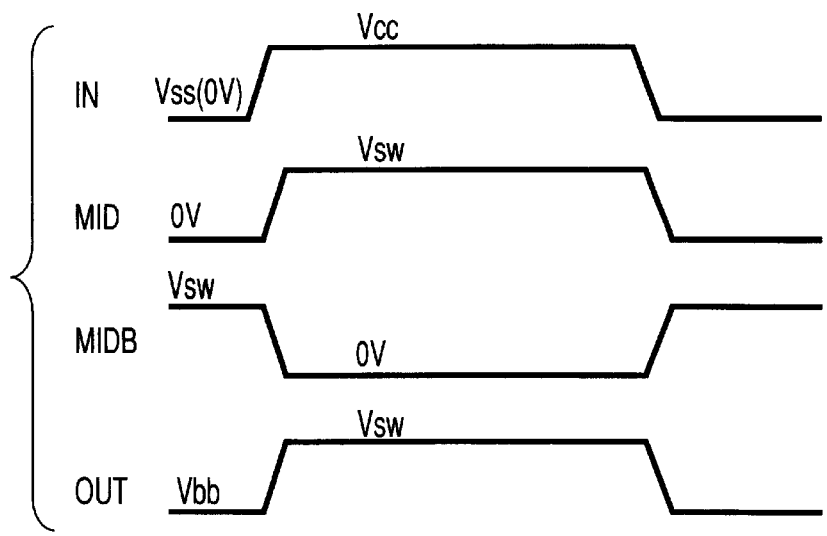
FIG. 5B
PRIOR ART

| | Initial state | Transition | End state |
|---|---|---|---|
| ND1 | VH | VH-(Vh-Vl) | VL |
| ND2 | VL | VL+(Vh-Vl) | VH |
| ND3 | Vh | Vl | Vl |
| ND4 | Vl | Vh | Vh |
| VCAP1 | \|Vh-VH\| | \|Vh-VH\| | \|Vl-VL\| |
| VCAP2 | \|Vl-VL\| | \|Vl-VL\| | \|Vh-VH\| |

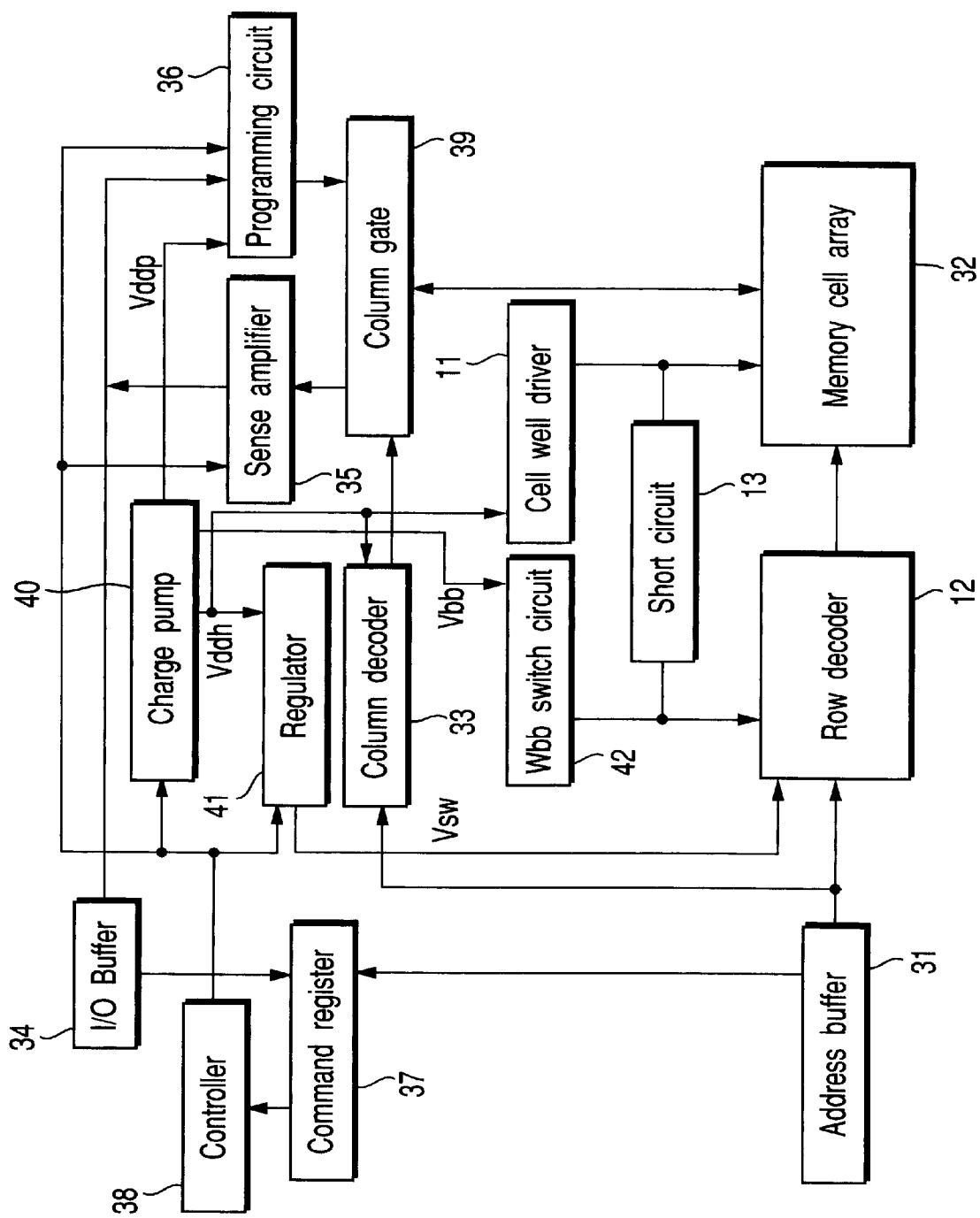
F I G. 11

US 6,600,679 B2

1

LEVEL SHIFTER FOR CONVERTING A VOLTAGE LEVEL AND A SEMICONDUCTOR MEMORY DEVICE HAVING THE LEVEL SHIFTER

CROSS-REFERENCE TO RELATED APPLICATIONS

This application is based upon and claims the benefit of priority from the prior Japanese Patent Application No. 2000-398388, filed on Dec. 27, 2000, the entire contents of which are incorporated herein by reference.

BACKGROUND OF THE INVENTION

1. Field of the Invention

The present invention relates to a level shifter for converting an input voltage level to a desired voltage level and outputting it and a semiconductor memory device having the level shifter and, in particular, a nonvolatile semiconductor memory device having the level shifter.

2. Description of the Related Art

Conventionally, a flash memory has been known as one of a nonvolatile semiconductor memory device. This flash memory is comprised of an EEPROM (electrically erasable PROM) and can erase data, at a time, stored in memory cells belonging to a block.

Now an explanation will be made below about a conventional flash memory.

FIG. 1 is a cross-sectional view showing a memory cell of a conventional flash memory.

An n type well area 102 is formed in a p type silicon semiconductor substrate 101 and a p type well area 103 is formed in the n type well area 102. In the p type well area 103, a drain diffusion region (n+type region) 104 and a source diffusion region (n+type region) 105 are formed such that they are spaced by a predetermined distance from each other.

A floating gate 107 is formed over the p type well region 103 between the drain diffusion region 104 and the source diffusion region 105 with a gate insulating film 106 interposed. Further, a control gate 109 is formed over the floating gate 107 with an insulating film 108 interposed.

In the so constructed memory cell, a threshold voltage as seen from the control gate 109 varies by the number of electrons stored in the floating gate 107.

FIG. 2 is a circuit diagram showing a configuration of a memory cell array comprised of a matrix array of such memory cells.

The control gate 109 of the memory cell MC is connected to a corresponding one of word lines WL0 to WLn. The drain of the memory cell MC is connected to a corresponding one of bit lines BL0 to BLm. The source of the memory cell MC is connected to a ground potential Vs.

FIG. 3 is a graph showing a drain current in the memory cell transistor. In the graph, data "0" represents a state corresponding to a relatively large number of electrons stored in the floating gate 107, that is, a high state of a threshold voltage Vt. On the other hand, data "1" represents a state corresponding to a relatively small number of electrons stored, that is, a low state of the threshold voltage Vt.

FIG. 4 shows the biasing conditions of data read, data write and data erase operations. In the data read operation, a gate voltage Vg is set to be 5V and a drain voltage Vd is set to be 1V. The data "0" or "1" is decided depending upon

2 whether or not there is a flowing of a cell current. The data erase operation is performed on each plurality of memory cells, at a time, sharing the source diffusion region 105 and p well area 103. In the data erase operation, the gate voltage is set to be −7.5V and the source voltage Vs is set to be 9V. In the data erase operation, electrons flow from the floating gate 107 into the substrate (p type well area 103) due to the F-N tunneling phenomenon and those erase target's memory cells are set to all "1".

Further, the Data write operation is performed at each bit unit. By biasing, to 5V, a bit line (Vd) on the cell to which the data "0" is written, the electrons of high energy generated due to a "channel hot electron phenomenon" are injected into the floating gate 107. The bit line of a cell on which the data "1" is to be held to the data "1" is set to 0V. At this time, there occurs no injection of the electrons and there is no variation in the threshold voltage.

In order to confirm whether, or not the write and erase operations are correctly performed, a write- and an erase-verifying operation are performed. The write-verifying operation is performed by reading out "0" under the application of a higher voltage Vpv than a voltage Vread at a reading time to the gate (see FIG. 3). The write operation and the write-verifying operation are alternately performed and, when those write target's cells are set to all "0", the write operation is completed.

At the erase operation, the erase-verifying operation is performed by reading unit "1" under the application of a lower voltage Vev than the voltage Vread at the reading time to the gate and, by doing so, a cell current Icell is adequately secured. As evident from the above, the word line voltage (gate voltage) on the memory cell varies in a various way.

Therefore, use is made of a level shifter for switching the word line voltage of the memory cell to above a power supply voltage or a negative voltage.

FIG. 5A shows a circuit diagram showing an arrangement of a conventional level shifter.

A high level shifter 101 is a circuit for converting a high-side voltage Vcc of an input signal IN and comprises n channel MOS transistors (hereinafter referred to as nMOS transistors) N21, N22 and p channel MOS transistors (hereinafter referred to as pMOS transistors). A low level shifter 102 is a circuit for converting a low-side voltage Vss (0V) of the input signal IN and comprises nMOS transistors N23, N24, N25 and N26 and pMOS transistors P23 and P24.

The operation of the level shifter will be explained below with the use of FIG. 5B.

FIG. 5B is a timing chart showing the operation of the level shifter. When the input signal IN is at a "0V", a node MID is set to 0V and a node MIDB is set to a voltage Vsw. And an output signal OUT appears as a voltage Vbb.

When, after this, the input signal IN varies from a "0V" to a voltage Vcc the node MID varies from the "0V" to a voltage Vsw and the node MIDB varies from the voltage Vsw to the "0V". And the output signal OUT varies from the voltage Vbb to the voltage Vsw.

Incidentally, as in other memory devices, the flash memory has also been formed as a high density integration unit with the microminiaturization of the memory cell. A transistor for high voltage is used for a row decoder and column gates, but such transistors needs to be laid out at a pitch of the memory cells and the scaling (downsizing) of the transistors is important to their high density integration. By converting a high voltage necessary to the writing and erasing of data to and from the memory cells, it is possible to achieve the scaling (downsizing) of the transistors for high voltage.

If, however, the high voltage necessary to the writing and erasing of the data to and from the memory cells is converted to a low voltage, the circuit operation of the level shifter shown in FIG. 5A becomes difficult. In the level shifter, a high level shifter 101 and low level shifter 102 can be adequately operated under the conventional voltage conditions of Vsw=2.5V and Vbb=−7.5V at a data erasing time. At this time, a maximum voltage of 10V is applied between the gate and the source, or between the source and the drain, of the transistor. If the maximum voltage is, for example, 9V for the downsizing of the transistor for high voltage, when the voltage on the word line is a constant voltage of −7.5V, the voltage conditions at the data erasing time will be Vsw=1.5V and Vbb=−7.5V. If, at this time, Vsw=1.5V, it becomes difficult to invert the output of the level shifter because the ON resistance of the pMOS transistor is large.

BRIEF SUMMARY OF THE INVENTION

A level shifter according to an aspect of the present invention comprises a latch circuit having a first node and a second node set to a first voltage or a second voltage, the second node being set to the second voltage when the first node is set to the first voltage and the second node being set to the first voltage when the first node is set to the second voltage; a first capacitor having a first terminal and a second terminal, the first terminal of the first capacitor being connected to the first node, a first signal being supplied to the second terminal of the first capacitor; and a second capacitor having a third terminal and a fourth terminal, the third terminal of the second capacitor being connected to the second node, when the first signal is supplied to the second terminal of the first capacitor, an inverted replica of the first signal being supplied to the fourth terminal of the second capacitor.

BRIEF DESCRIPTION OF THE SEVERAL VIEWS OF THE DRAWING

FIG. 4 is a table showing biasing conditions under which data read, data write and data erase operations are performed in the conventional flash memory;

FIG. 5A is a circuit diagram showing an arrangement of a conventional level shifter;

FIG. 5B is a timing chart showing an operation of the conventional level shifter;

FIG. 11 is a block diagram showing an arrangement of a semiconductor memory device according to a third embodiment of the present invention.

DETAILED DESCRIPTION OF THE INVENTION

The embodiments of the present invention will be described below by referring to the accompanying drawing.
First Embodiment First, an explanation will be made below about a level shifter of the first embodiment of the present invention.

Figure 1:
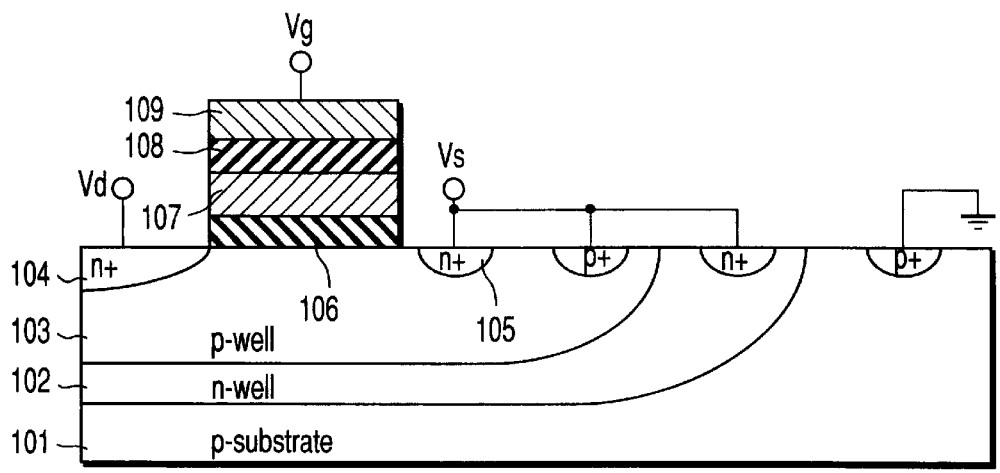
FIG. 1 is a cross-sectional view showing a memory cell of a conventional flash memory.
Figure 2:
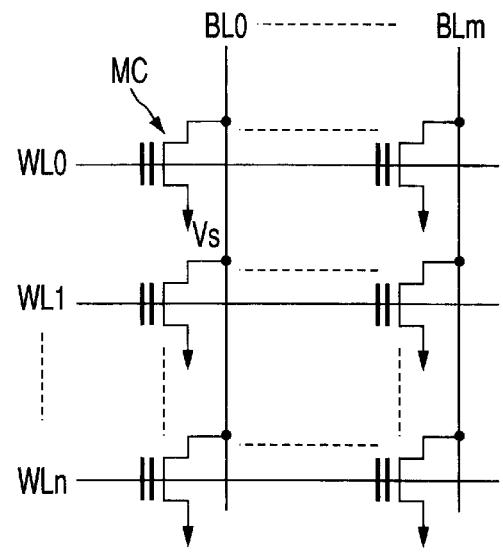
FIG. 2 is a circuit diagram showing an arrangement of a memory cell array constituting a matrix array of such memory cells.
Figure 3:
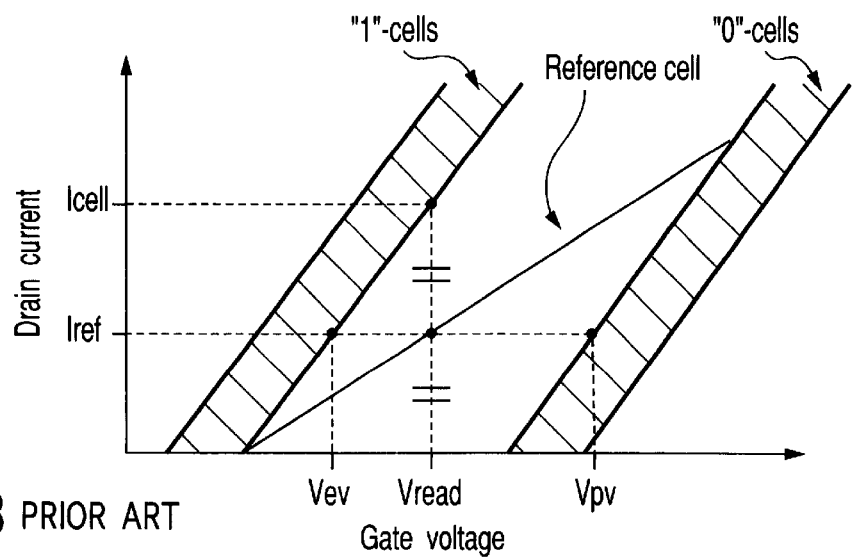
FIG. 3 is a graph showing a drain current of the memory cells of FIG. 2.
Figures 6, 7:
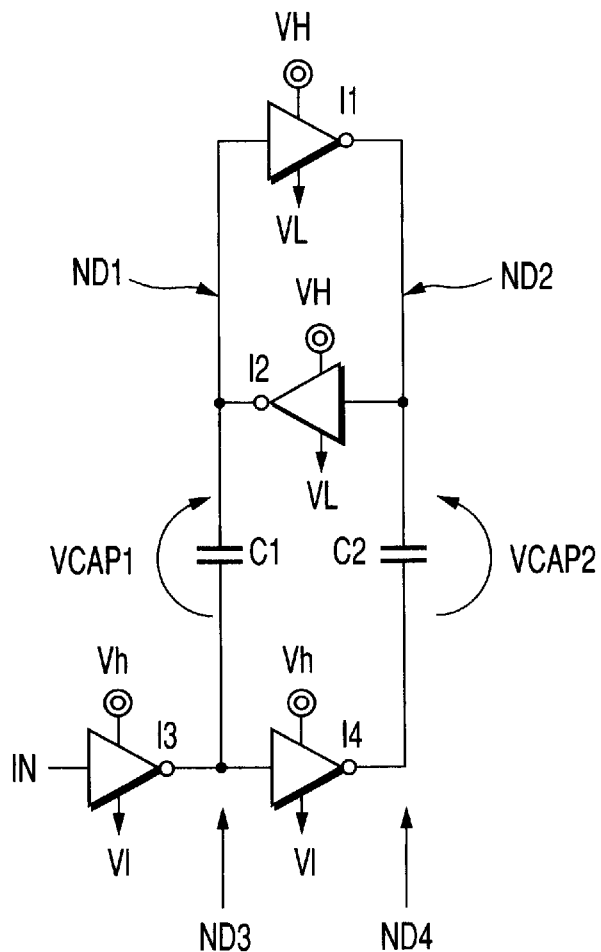
FIG. 6 is a circuit diagram showing an arrangement of a level shifter according to a first embodiment of the present invention.
FIG. 7 is a table showing a potential on each node in the level shifter according to the first embodiment.

FIG. 6 is a circuit diagram showing an arrangement of a level shifter according to the first embodiment.

This level shifter has inverting elements I1, I2, I3 and I4 and capacitors C1 and C2. The two inverting elements I1 and I2 form a latch circuit. One terminal of the capacitor C1 is connected to one node ND1 of the latch circuit. One terminal of the capacitor C2 is connected to the other node ND2 of the latch circuit. Further, the inverting elements I3 and I4 supply their inverted potentials to the capacitors C1 and C2, respectively.

An input signal IN is supplied to the input terminal of the inverting element I3. The output terminal of the inverting element I3 is connected to the other terminal of the capacitor C1 and to the input terminal of the inverting element I4. The output terminal of the inverting element I4 is connected to the other terminal of the capacitor C2. The one terminal side of the capacitor C1 is connected to an input terminal of the inverting element I1 and to an output terminal of the inverting element I2. Further, the one terminal side of the capacitor C2 is connected to an output terminal of the inverting element I1 and to an input terminal of the inverting element I2.

The inverting elements I1 and I2 are comprised of elements driven with a potential difference between a voltage VH and a voltage VL. Further, the inverting elements I3 and I4 are comprised of elements driven with a potential difference between a voltage Vh and a voltage Vl.

The operation of the level shifter shown in FIG. 6 is as follows. FIG. 7 is a table showing the potential of each node of the level shifter.

As set out above, one terminal of the latch circuit comprised of the inverting elements I1 and I2 is indicated by the node ND1 and the other terminal of the latch circuit is indicated by the node ND2. Further, the output terminal of the inverting element I3 is indicated by a node ND3 and the output terminal of the inverting element I4 is indicated by a node ND4. VCAP1 shows a potential difference across the capacitor C1 and VCAP2 shows a potential difference across the capacitor C2.

Let it be assumed that, at an initial state, a voltage Vss lower than a circuit threshold value of the inverting element I3 is inputted as an input signal IN to the inverting element I3. In this case, as shown in FIG. 7, a voltage Vh is outputted from the inverting element I3 and a potential on the node ND3 becomes a voltage Vh. The voltage Vh is inputted to the other terminal side of the capacitor C1 and to the inverting element I4. From the inverting element I4 a voltage Vl is outputted and a potential on the node ND4 becomes a voltage Vl. The voltage Vl is inputted to the other terminal side of the capacitor C2.

Since the node ND1 is set to a voltage VH, a potential difference VCAP1 across the capacitor C1 becomes a potential |Vh−VH|. A potential difference VCAP2 across the capacitor C2 becomes a potential |Vl−VL| because the node ND2 is set to a voltage VL. Then, a voltage Vcc higher than the circuit threshold value of the inverting element I3 is inputted as an input signal IN to the inverting element I3. Then, from the inverting element I3 a voltage Vl is outputted and the node ND3 is set to a voltage Vl. The voltage Vl is inputted to the other terminal side of the capacitor C1 and to the inverting element I4. From the inverting element I4, a voltage Vh is outputted and the node ND4 is set to a voltage Vh. The voltage Vh is inputted to the other input side of the capacitor C2.

When a potential on the node ND3 varies from the voltage Vh to a voltage Vl, a potential difference VCAP1 across the capacitor C1 is held to |Vh−VH| and, due to a capacitive coupling, a potential on the node ND1 causes a transition to VH−(Vh−Vl).

When, on the other hand, a potential on the node ND4 varies from the voltage Vl to a voltage Vh, a potential difference VCAP2 across the capacitance C2 is held to |Vl−VL| and, due to the capacitive coupling, a potential on the node ND2 causes a transition to VL+(Vh−Vl).

If, here, the respective voltages VH, VL, Vh and Vl are so set as to make a potential on the node ND1 lower than a potential on the node ND2, that is, VH−(Vh−Vl)<VL+(Vh−Vl), then the potential on the node ND1 and potential on the node ND2 are inverted, so that the node ND1 is set to VL and the node ND2 is set to a voltage VH. When the potential on the node ND1 and potential on the ND2 are inverted and become stable, the potential difference VCAP1 becomes |Vl−VL| and the potential difference VCAP2 becomes |Vh−VH|. In this connection it is to be noted that, since, in the transition state, the potential on the node ND1 and potential on the node ND2 need to be higher and lower, respectively, than the voltage VL and voltage VH, it is necessary to satisfy VH−(Vh−Vl)<VL and VL+(Vh−Vl)<VH.

Let it be assumed that the withstand voltage (maximum voltage) of the inverting elements I1, I2 is represented by Vmax1, the withstand voltage of the inverting elements I3, I4 is represented by Vmax2 and the withstand voltage of the capacitors C1, C2 is represented by Vmax3. At this time, the condition under which the inverting elements I1, I2 do not exceed the withstand voltage is given by VH−VL−<Vmax1 and the condition under which the inverting elements I3, I4 do not exceed the withstand voltage is given by Vh−Vl≦Vmax2. Further, the condition under which potentials across the capacitors C1, C2 do not exceed the withstand voltage is given by Vh−VH≦Vmax3, Vl−VL≦Vmax3.

In the first embodiment, as set out above, use is made of a voltage combination under which a high/low level relation of the nodes ND1 and ND2 varies, due to the capacitive coupling, when the potentials on one terminal sides of the capacitors C1, C2 are mutually inverted. By doing so, the latching state of the latch circuit configured by the inverting elements I1, I2 is inverted and, hence, a signal of an amplitude Vss to Vcc inputted to the inverting element I3 can be converted to a signal from a lowered voltage VL to a raised voltage VH.

Second Embodiment

As a second embodiment of the present invention, the level shifter above will be explained in more detail below.

Figure 8:
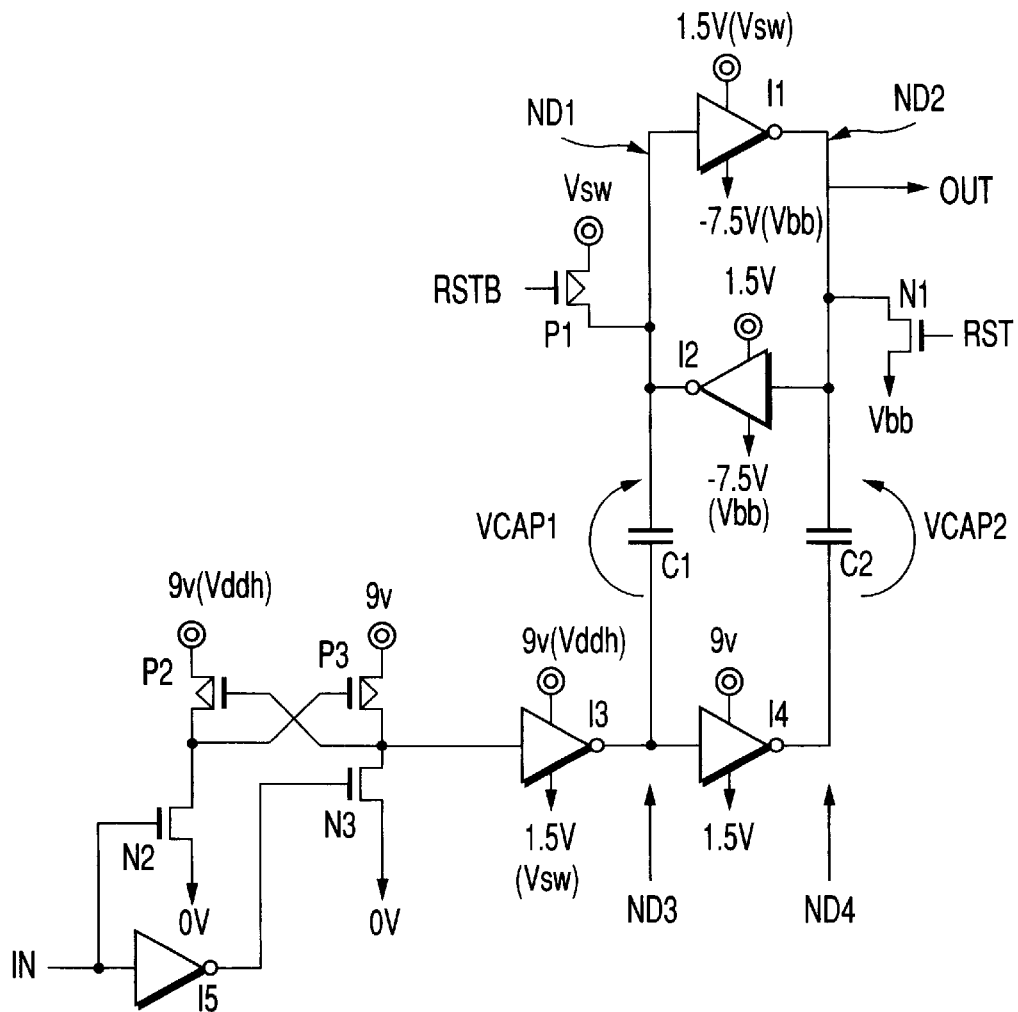
FIG. 8 is a circuit diagram showing an arrangement of a level shifter according to a second embodiment of the present invention.

FIG. 8 is a circuit diagram showing an arrangement of the level shifter according to the second embodiment of the present invention.

As shown in FIG. 8, this level shifter is of such a type that, to the arrangement of the first embodiment, another level shifter is connected at the input terminal of the inverting element I3 and, further, a pMOS transistor P1 and nMOS transistor N1 are connected to the node ND1 and node ND2, respectively. In this embodiment, the same reference numerals are employed to designate parts or elements corresponding to those shown in the first embodiment and any further explanation is omitted except for different parts and elements.

The level shifter connected to the input terminal of the inverting element I3 comprises pMOS transistors P2, P3, nMOS transistors N2, N3 and an inverting element I5. This level shifter converts a signal of an amplitude 0V to Vcc (5V) to a signal of an amplitude 0V to 9V (Vddh). The pMOS transistor P1 is comprised of a transistor for pullup to a voltage Vsw and, to the gate of the PMOS transistor P1, a signal RSTB is inputted. The nMOS transistor N1 is comprised of a transistor for pulldown to a voltage Vbb and, to the gate of the nMOS transistor N1, a signal RST is inputted.

The level shifter shown in FIG. 8 operates as follows.

The inverting elements I1 and I2 in FIG. 8 are comprised of elements driven with a power supply voltage Vsw (1.5V) and Vbb (−7.5V). The inverting elements I3 and I4 are comprised of elements driven with a power supply voltage Vddh (9V) and Vsw (1.5V). Further, the inverting element I5 is comprised of an element driven with a power supply voltage Vcc (5V) and 0V.

In an initial state, the transistors P1 and N1 are turned ON by the signals RSTB and RST, a potential on the node ND1 is set to 1.5V and a potential on the node ND2 is set to −7.5V. When an input signal IN of 0V is supplied to the input terminal of the inverting element I5, then the 0V is inputted to the inverting element I3. In this case, 9V is outputted from the inverting element I3 and a potential on the node ND3 is set to 9V. The 9V is inputted to the other terminal side of the capacitor C1 and to the inverting element I4. From the inverting element I4, 1.5V is outputted and a potential on the node ND4 becomes 1.5V and the 1.5V is inputted to the other terminal side of the capacitor C2.

By doing so, the node ND1 is set to 1.5V and a potential difference VCAP1 across the capacitor C1 becomes 7.5V. And a potential difference VCAP2 across the capacitor C2 becomes 9V since the node ND2 is set to −7.5V.

When an input signal IN of a voltage Vcc is supplied to the input terminal of the inverting element I5, 9V is inputted to the inverting element I3. Then, 1.5V is outputted from the inverting element I3 and a potential on the node ND3 becomes 1.5V. This potential is inputted to the other terminal side of the capacitor C1 and to the inverting element I4. From the inverting element I4, 9V is outputted and a potential on the node ND4 becomes 9V and this potential is inputted to the other terminal side of the capacitor C2.

When a potential on the node ND3 varies from 9V to 1.5V, a potential difference VCAP1 across the capacitor C1 is held to 7.5V and, due to the capacitive coupling, a potential on the node ND1 causes a transition to −6V.

When, on the other hand, a potential on the node ND4 varies from 1.5V to 9V, a potential difference VCAP2 across the capacitor C2 is held to 9V and, due to the capacitive coupling, a potential on the node ND2 causes a transition to 0V.

Since, here, a potential (−6V) on the node ND1<a potential (0V) on the node ND2, the latch circuit composed of the inverting elements I1, I2 amplifies a voltage "just after the transition" to set the node ND1 to −7.5V and the node ND2 to 1.5V. In this way, the potential on the node ND1 and the potential on the node ND2 are inverted through the capacitive coupling of the capacitors C1 and C2. And the potential on the node ND1 is converted from 1.5V to −7.5V and the potential on the node N2 is converted from −7.5V to 1.5V.

As set out above, use is made of a voltage combination under which the high/low level relation of the node ND1 and node ND2 varies due to a capacitive coupling when the potentials on one terminal sides of the capacitors C1 and C2 are mutually inverted and, by doing so, the latching state of the latch circuit comprised of the inverting elements I1, I2 is inverted. Thus a signal of an amplitude 0V to Vcc (5V) inputted to the inverting element I5 can be converted to a signal from a voltage Vsw (−7.5V) to a voltage Vbb.

An explanation will be made below about an erase voltage resetting circuit using the level shifter shown in FIG. 8.

Figure 9:
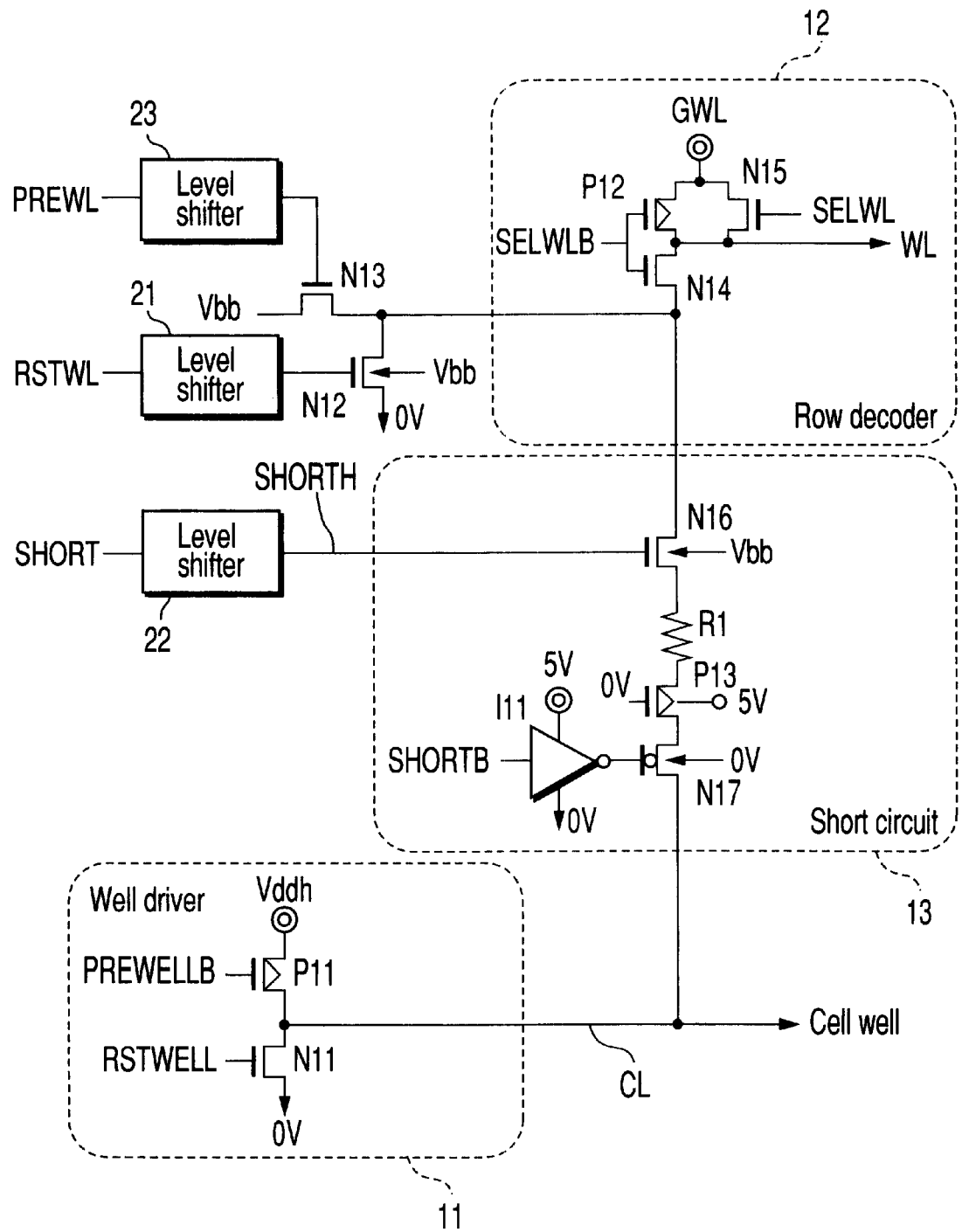
FIG. 9 is a circuit diagram showing an arrangement of an erase voltage resetting circuit using the level shifter of the second embodiment.
Figure 10:
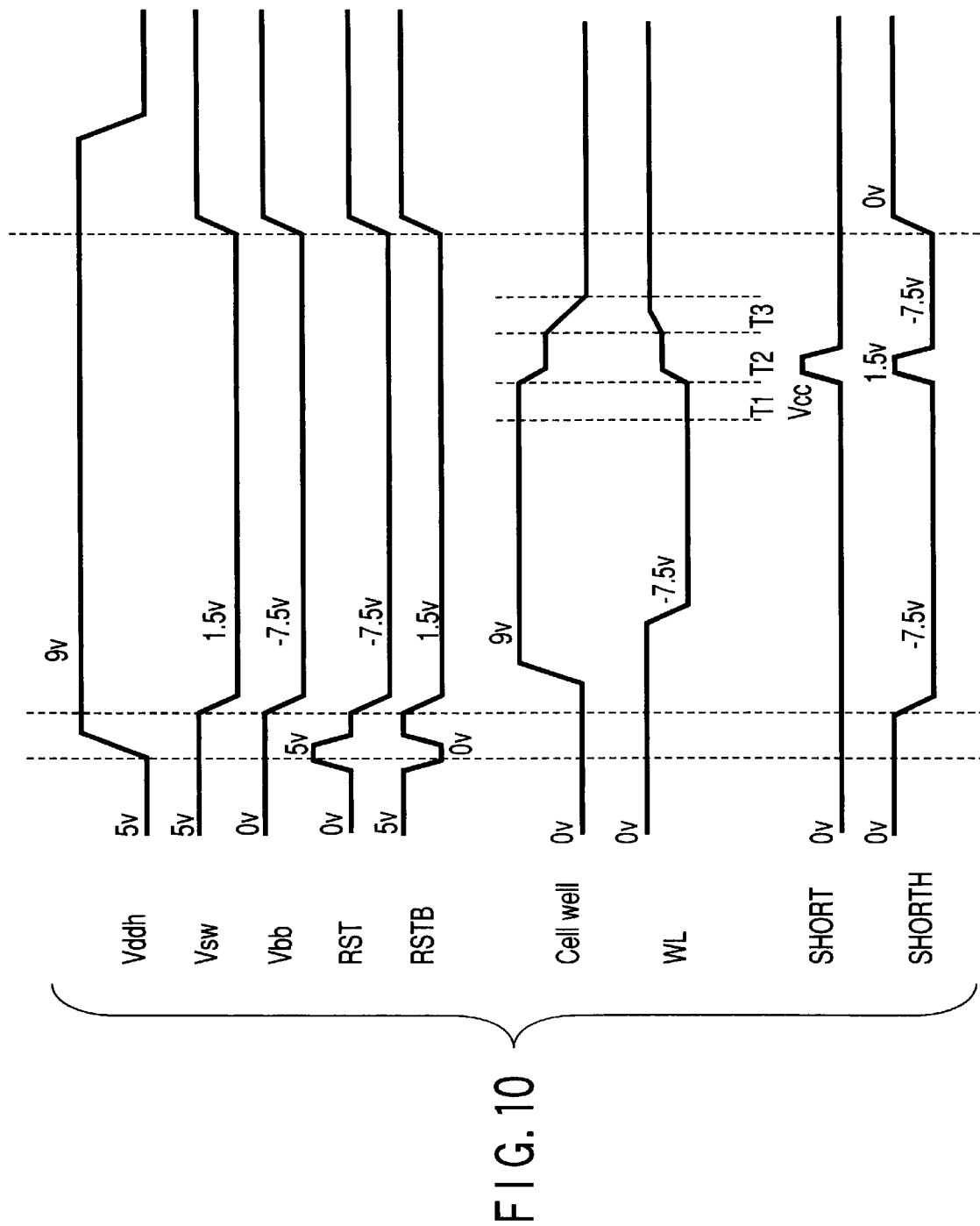
FIG. 10 is a timing chart showing the operation of the erase voltage resetting circuit.

FIG. 9 is a circuit diagram showing an arrangement of the erase voltage resetting circuit using the level shifter. FIG. 10 is a timing chart showing the operation of the erase voltage resetting circuit.

This erase voltage resetting circuit comprises a cell well driver 11, a row decoder 12, a short circuit 13, level shifters 21, 22, 23, and nMOS transistors N12, N13. The cell well driver 11 supplies a predetermined potential to a well area at an erase operation time. The row decoder 12 comprised of a circuit for selecting and driving a word line. The nMOS transistor N12 supplies 0V to the row decoder in accordance with an output of the level shifter 21. The nMOS transistor N13 supplies a voltage Vbb to the row decoder in accordance with an output of the level shifter 23. The short circuit 13 shorts the well area and word line in accordance with an output of the level shifter 22.

The arrangement of the cell well driver 11 is as follows.

The drain of a pMOS transistor P11 is connected to the drain of an nMOS transistor N11. To their connection point is connected a well potential supply line CL connected to the well area of the memory cell.

A signal PREWELLB is inputted to the gate of the pMOS transistor P11 and the source of the PMOS transistor P11 is supplied with a voltage Vddh. A signal RSTWELL is inputted to the gate of the nMOS transistor N11 and the source of the nMOS transistor N11 is supplied with 0V.

The circuit arrangement of the row decoder 12 is as follows.

The drain of an nMOS transistor N14, the drain of a pMOS transistor P12 and the source of an nMOS transistor N15 are connected to a word line WL. A signal SELWLB is supplied to the gate of the nMOS transistor N14 and the gate of pMOS transistor P12. A voltage GWL is applied to the source of the pMOS transistor P12 and the drain of the nMOS transistor N15. Further, to the gate of the nMOS transistor N15 a signal SELWL is inputted.

The source of the nMOS transistor N12 and the drain of the nMOS transistor N13 are connected to the source of the nMOS transistor N14 in the row decoder 12. To the gate of the nMOS transistor N12 the output terminal of the level shifter 21 is connected. The output terminal of the level shifter 23 is connected to the gate of the nMOS transistor N13.

To the input terminal of the level shifter 21 a signal RSTWL is inputted. A signal PREWL is inputted to the input terminal of the level shifter 23. The drain of the nMOS transistor N12 is supplied with 0V and the source of the nMOS transistor N13 is supplied with a voltage Vbb.

The arrangement of the short circuit 13 is as follows.

The source of an nMOS transistor N16 is connected to the source of the nMOS transistor N14 in the row decoder 12. The drain of the nMOS transistor N16 is connected through a resistor R1 to the drain of a pMOS transistor P13. The source of the pMOS transistor P13 is connected to the source of an intrinsic type nMOS transistor N17. The drain of the nMOS transistor N17 is connected to the well potential supply line CL.

The gate of the pMOS transistor P13 is supplied with 0V. To the gate of the nMOS transistor N17, the output terminal of an inverting element I11 is connected. A signal SHORTB is inputted to the input terminal of the inverting element I11.

Further, the output terminal of the level shifter 22 is connected to the gate of the nMOS transistor N16. A signal SHORT is inputted to the input terminal of the level shifter 22.

The erase voltage resetting circuit operates as follows.

At a start of the erase operation, the level shifter is initialized by the transistors RST and RSTB. After this, a signal PREWELLB which is inputted to the gate of the pMOS transistor P11 is set to 0V and a voltage Vddh is outputted to the well potential supply line CL and the voltage Vddh (9V) is applied to the well area of a cell array. By doing so, the well area is charged to 9V.

Further, the output of the level shifter 23 to which the signal PREWL is inputted is set to 1.5V with a signal SELWLB set to "H" and signal SELWL set to "L". By doing so, a voltage Vbb (−7.5V) is applied to the word line WL to allow the word line WL to be charged to −7.5V. In this way, electrons which are accumulated to the floating gate of the memory cell are released to allow data to be erased.

After an elapse of a predetermined erase time, during a period T1, the signal PREWELLB is set to the voltage Vddh to allow the transistor P11 to be turned OFF and a supply of the voltage Vddh to the well potential supply line CL to be stopped. At the same time, the output of the level shifter 23 is set by the signal PREWL to −7.5V to allow the transistor N13 to be turned OFF and a supply of a voltage Vbb to the word line WL to be stopped.

During the period T2, a signal SHORT which is inputted to the level shifter 22 is set to a voltage Vcc to allow a signal SHORTH which is outputted from the level shifter 22 to be set to 1.5V. By doing so, the nMOS transistor N16 is turned ON, thus shorting the well potential supply line CL (well area) and the word line WL. Then, during a period T3, the transistor N11 is turned ON to discharge the well area to a ground potential (0V) while, at the same time, the transistor N12 is turned ON to discharge the word line WL to the ground potential. After this, the voltages Vddh, Vsw and Vbb are brought back to their standby voltage values.

Since, in the level shifter having the erase voltage resetting circuit, a logical signal of a raised voltage or lowered voltage is inverted by the capacitive coupling, not directly by the transistor, the operation of the level shifter is not restricted by a higher ohmic resistance of the transistor caused by a lowering of the operation voltage. It is, therefore, possible to perform the operation of the level shifter even if the operation voltage is low. Even if the voltage Vsw which is supplied to the level shifter is lowered, it is possible to operate the level shifter and hence to normally operate the erase voltage resetting circuit. Since it is possible to operate the level shifter, even if the operation voltage is low, and hence to effect the scaling (downsizing) of the transistor for high voltage, it is possible to provide a flash memory ensuring a high density integration.

Third Embodiment

A semiconductor memory device having the erase voltage resetting circuit of the second embodiment will be explained below as a third embodiment of the present embodiment.

FIG. 11 is a block diagram showing the arrangement of a semiconductor memory device of the third embodiment of the present invention.

An address buffer 31 delivers an address which corresponds to a memory cell of a memory cell array 32 to a row decoder 12 and a column decoder 33 to allow it to be read or written or erased. At a read time, an IO buffer 34 allows data of the memory cell which is sensed at a sense amplifier 35 to be outputted to an outside. At a write time, data to be written is inputted to the IO buffer 34 and the programming circuit 36 allows a write voltage to be outputted to the drain of the memory cell.

A command register 37 retains an inputted command, such as a write and an erase command. A controller 38 issues an operation control signal to control the operation of the semiconductor memory device. The row decoder 12 selects a word line on the memory cell and the column decoder 33 selects a column gate 39 to connect the bit line to the sense amplifier 35 or the programming circuit 36. A charge pump 40 generates a read or write or erase voltage.

A regulator 41 generates a controlled voltage Vsw to allow the voltage Vsw to be applied to a select word line WL. A cell well driver 11 charges or discharges a well area in the memory cell. A Vbb switch circuit 42 is turned ON at a time of an erase operation to supply a voltage Vbb (−7.5V) and is turned OFF otherwise. A short circuit 13 shorts the well area and the word line WL after an erase operation.

In the level shifter having the semiconductor memory device, the logical signal of a raised voltage or lowered voltage is inverted by a capacitive coupling of the capacitor, not directly by a transistor. Even if, therefore, the operation voltage is low, it is possible to operate the level shifter without involving any restricted operation caused by a higher ON resistance of the transistor resulting from a lowering of the operation voltage. By allowing the operation of the level shifter to be effected even when the operation voltage is low, it is possible to effect the scaling (downsizing) of transistors for high voltage and hence to provide a flash memory ensuring a high density integration.

Figure 12A:
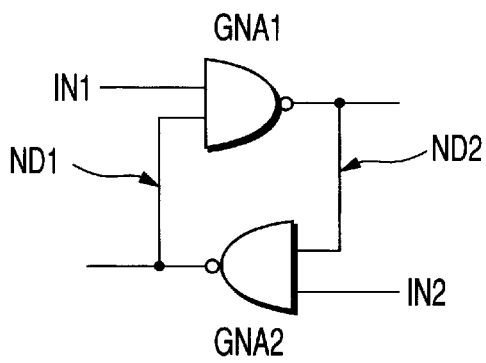
FIGS. 12A and 12B are circuit diagrams showing other practical forms of the latch circuit in the level shifter of the first and second embodiments.
Figure 12B:
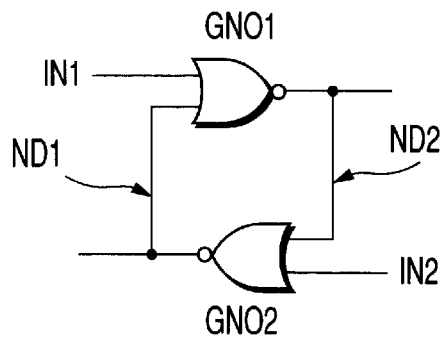

Although, in the first embodiment shown in FIG. 6 and second embodiment shown in FIG. 8, the latch circuit has been comprised of two inverting elements, the present invention is not restricted to the latch circuit of such an arrangement as set out above, any other latch circuits, such as those shown in FIGS. 12A and 12B, may be used.

A latch circuit shown in FIG. 12A is comprised of two NAND circuits GNA1, GNA2. The output terminal (node ND2) of the NAND circuit GNA1 is connected to a first input terminal of the NAND circuit GNA2. The output terminal (node ND1) of the NAND circuit GNA2 is connected to a first input terminal of the NAND circuit GNA1. A signal IN1 is inputted to a second input terminal of the NAND circuit GNA1. Further, a signal IN2 is inputted to a second input terminal of the NAND circuit GNA2.

If, in the latch circuit shown in FIG. 12A, for example, the node ND1 and node ND2 are initialized to a voltage VH and voltage VL, respectively, the signal IN1 and signal IN2 are set to "H" and "L", respectively, and the node ND1 and node ND2 are set to a voltage VH and voltage VL, respectively. Further, the signal IN2 is set to the "H" so as to enable the potential on the node ND1 and potential on the node ND2 to be inverted. If, after this, the potential on the node ND1 and potential on the node ND2 are to be inverted, this inversion can be done, as set out in the first embodiment, with the use of capacitors C1 and C2 connected to the nodes ND1 and ND2, respectively.

Further, the latch circuit shown in FIG. 12B is comprised of NOR circuits GNO1 and GNO2. An output terminal (node ND2) of the NOR circuit GNO1 is connected to a first input terminal of the NOR circuit GNO2. An output terminal (node ND1) of the NOR circuit GNO2 is connected to a first input terminal of the NOR circuit GNO1. A signal IN1 is inputted to a second input terminal of the NOR circuit GNO1 and a signal IN2 is inputted to a second input terminal of the NOR circuit GNO2.

If, in the latch circuit shown in FIG. 12B, for example, the node ND1 and node ND2 are initialized to a voltage VH and voltage VL, respectively, the signal IN1 and signal IN2 are set to "H" and "L", respectively, and the node ND1 and node ND2 are set to the voltage VH and voltage VL, respectively. Further, the signal IN1 is set to "L" so as to allow a potential on the node ND1 and potential on the node ND2 to be inverted. If, after this, the potential on the node ND1 and potential on the node ND2 are to be inverted, such inversion is effected with the use of the capacitor C1 and C2 connected to the nodes ND1 and ND2 as set out in connection with the first embodiment.

As set out above, according to the embodiment of the present invention, it is possible to provide a level shifter adequately operable even if the operation voltage is lowered and, further, to provide a semiconductor memory device having a level shifter capable of a high density integration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A level shifter comprising:
    a latch circuit having a first node and a second node set to a first voltage or a second voltage, said second node being set to said second voltage when said first node is set to said first voltage and said second node being set to said first voltage when said first node is set to said second voltage;
    a first capacitor having a first terminal and a second terminal, said first terminal of said first capacitor being connected to said first node, a first signal being supplied to said second terminal of said first capacitor; and
    a second capacitor having a third terminal and a fourth terminal, said third terminal of said second capacitor being connected to said second node, when said first signal is supplied to said second terminal of said first capacitor, an inverted replica of said first signal being supplied to said fourth terminal of said second capacitor.

2. The level shifter according to claim 1, wherein said latch circuit has a plurality of inverting elements including first and second inverting elements and, of said plurality of inverting elements, an output terminal of said first inverting element is connected to an input terminal of said second inverting element.

3. The level shifter according to claim 1, wherein, with VH and VL representing said first voltage and said second voltage, respectively, and Vh and Vl representing a first logical voltage of said first signal and second logical voltage of an inverted replica of said first signal, respectively, a value of VH−Vh+Vl is smaller than a value of VL+Vh−Vl.

4. The level shifter according to claim 3, wherein the value of VH−Vh+Vl is larger than VL and the value of VL+Vh−Vl is smaller than VH.

5. The level shifter according to claim 3, wherein a value of Vh−VH is equal to or smaller than a value of VH−VL and a value of Vl−VL is equal to or smaller than the value of VH−VL.

6. The level shifter according to claim 3, wherein a value of VH−VL is smaller than a withstand voltage of the latch circuit.

7. The level shifter according to claim 3, further comprising a plurality of third inverting elements generating Vh and Vl.

8. The level shifter according to claim 7, wherein a value of Vh−Vl is smaller than a withstand voltage of said third inverting element.

9. The level shifter according to claim 1, further comprising a resetting transistor initializing a potential on said first node and a potential on said second node.

10. A semiconductor memory device comprising:
a nonvolatile memory cell formed of a semiconductor substrate and having a floating gate and a control gate, said nonvolatile memory cell storing data by accumulating a charge amount in the floating gate;
a row decoder selecting and driving a word line connected to said control gate;
a driver controlling a potential of said semiconductor substrate;
a short circuit shorting said semiconductor substrate and said word line; and
a first level shifter having a first latch circuit, a first capacitor and a second capacitor,
said first latch circuit having a first node and a second node set to a first voltage or a second voltage, said second node being set to said second voltage when said first node is set to said first voltage and said second node being set to said first voltage when said first node is set to said second voltage
said first capacitor having a first terminal and a second terminal and said first terminal of said first capacitor being connected to said first node,
said second capacitor having a third terminal and a fourth terminal and said third terminal of said capacitor being connected to said second node,
wherein data erase operation of said nonvolatile memory cell is performed by applying a negative voltage to said word line and a positive voltage to said semiconductor substrate, said first level shifter allows a first signal to be supplied to said second terminal of said first capacitor and an inverted replica of said first signal to be supplied to said fourth terminal of said second capacitor to output a voltage different from the voltage of said first signal, and said short circuit shorts said semiconductor substrate and said word line in accordance with an output of said first level shifter after the data erase operation has been completed.

11. The semiconductor memory device according to claim 10, wherein said latch circuit has a plurality of inverting elements including a first inverting element and a second inverting element and, of said plurality of inverting elements, an output terminal of said first inverting element is connected to an input terminal of said second inverting element.

12. The semiconductor memory device according to claim 10, wherein, with VH and VL representing said first voltage and said second voltage, respectively, and Vh and Vl representing a first logical voltage of said first signal and a second logical voltage of an inverted replica of said first signal, a value of VH−Vh+Vl is smaller than a value of VL+Vh−Vl.

13. The semiconductor memory device according to claim 12, wherein the value of VH−Vh+Vl is larger than VL and the value of VL+Vh−Vl is smaller than VH.

14. The semiconductor memory device according to claim 12, wherein a value of Vh−VH is equal to or smaller than a value of VH−VL and a value of Vl−VL is equal to or smaller than a value of VH−VL.

15. The semiconductor memory device according to claim 12, wherein a value of VH−VL is smaller than a withstand voltage of said latch circuit.

16. The semiconductor memory device according to claim 12, further comprising a plurality of third inverting elements generating the voltage Vh and Vl.

17. The semiconductor memory device according to claim 16, wherein a value of Vh−Vl is smaller than a withstand voltage of said third inverting element.

18. The semiconductor memory device according to claim 12, wherein Vh represents a potential of said semiconductor substrate at a time of an erase operation.

19. The semiconductor memory device according to claim 12, wherein VL represents a potential on said word line at a time of an erase operation.

20. The semiconductor memory device according to claim 12, wherein VH is equal to Vl.

21. The semiconductor memory device according to claim 10, further comprising,
a second level shifter having a second latch circuit, a third capacitor and a fourth capacitor,
said second latch circuit having a third node and a fourth node set to a third voltage or a fourth voltage, said fourth node being set to said fourth voltage when said third node is set to said third voltage and said fourth node being set to said third voltage when said third node is set to said fourth voltage,
said third capacitor having a fifth terminal and a sixth terminal and said fifth terminal of said third capacitor being connected to said third node,
said fourth capacitor having a seventh terminal and an eighth terminal and said seventh terminal of said fourth capacitor being connected to said fourth node; and
a first switch circuit supplying said negative voltage to said word line in accordance with an output of said second level shifter.

22. The semiconductor memory device according to claim 21, further comprising,
a third level shifter having a third latch circuit, a fifth capacitor and a sixth capacitor,
said third latch circuit having a fifth node and a sixth node set to a fifth voltage or a sixth voltage, said sixth node being set to said sixth voltage when said fifth node is set to said fifth voltage and said sixth node being set to said fifth voltage when said fifth node is set to said sixth voltage,
said fifth capacitor having a ninth terminal and a tenth terminal, said ninth terminal of said fifth capacitor being connected to said fifth node,
said sixth capacitor having an eleventh terminal and a twelfth terminal and said eleventh terminal of said sixth capacitor being connected to said sixth node; and
a second switch circuit supplying a predetermined voltage to said word line in accordance with an output of said third level shifter.

23. The semiconductor memory device according to claim 10, further comprising a resetting transistor initializing a potential on said first node and a potential on said second node.

* * * * *